United States Patent
Huh

(10) Patent No.: US 8,593,380 B2
(45) Date of Patent: Nov. 26, 2013

(54) ORGANIC LIGHT EMITTING DIODE DISPLAY AND METHOD OF MANUFACTURING THE SAME

(75) Inventor: Jong-Moo Huh, Hwasung-si (KR)

(73) Assignee: Samsung Display Co., Ltd. (KR)

(*) Notice: Subject to any disclaimer, the term of this patent is extended or adjusted under 35 U.S.C. 154(b) by 1398 days.

(21) Appl. No.: 11/676,767

(22) Filed: Feb. 20, 2007

(65) Prior Publication Data
US 2007/0194326 A1 Aug. 23, 2007

(30) Foreign Application Priority Data

Feb. 20, 2006 (KR) .................. 10-2006-0016109

(51) Int. Cl.
*G09G 3/32* (2006.01)
(52) U.S. Cl.
USPC ........................................... 345/82
(58) Field of Classification Search
USPC ................................... 345/82, 76
See application file for complete search history.

(56) References Cited

U.S. PATENT DOCUMENTS

| | | | |
|---|---|---|---|
| 5,047,360 A | 9/1991 | Nicholas | |
| 5,818,070 A | 10/1998 | Yamazaki et al. | |
| 6,143,582 A | 11/2000 | Vu et al. | |
| 2005/0030265 A1* | 2/2005 | Miyagawa | 345/76 |

FOREIGN PATENT DOCUMENTS

| | | |
|---|---|---|
| JP | 2000-221907 | 8/2000 |
| JP | 2002-132184 | 5/2002 |
| JP | 2003-209118 | 7/2003 |
| JP | 2005-079549 | 3/2005 |
| KR | 1020040030332 | 4/2004 |
| KR | 1020040041982 | 5/2004 |
| KR | 1020040062095 | 7/2004 |
| KR | 1020050009532 | 1/2005 |
| KR | 1020050012957 | 2/2005 |
| KR | 1020050066630 | 6/2005 |
| KR | 1020050067255 | 7/2005 |
| KR | 1020050099339 | 10/2005 |

* cited by examiner

*Primary Examiner* — Fred Tzeng
(74) *Attorney, Agent, or Firm* — Cantor Colburn LLP

(57) ABSTRACT

An organic light emitting diode ("OLED") display includes; a substrate, first and second signal lines which intersect each other and are disposed on the substrate, a switching control electrode connected to the first signal line, a switching input electrode connected to the second signal line, a switching output electrode disposed substantially opposite the switching input electrode with respect to the switching control electrode, a switching semiconductor which partially overlaps the switching input electrode and the switching output electrode, first and second driving control electrodes connected to the switching output electrode, a driving semiconductor disposed between the first and second driving control electrodes, a driving input electrode and a driving output electrode which partially overlap the driving semiconductor and are disposed substantially opposite each other with respect to the driving semiconductor, a first electrode connected to the driving output electrode, a second electrode which faces the first electrode, and a light emitting member disposed between the first electrode and the second electrode.

10 Claims, 17 Drawing Sheets

ORGANIC LIGHT EMITTING DIODE DISPLAY AND METHOD OF MANUFACTURING THE SAME

This application claims priority to Korean Patent Application No. 10-2006-0016109, filed on Feb. 20, 2006, and all the benefits accruing therefrom under 35 U.S.C. §119, the contents of which in its entirety are herein incorporated by reference.

BACKGROUND OF THE INVENTION (a) Field of the Invention

The present invention relates to an organic light emitting diode ("OLED") display and a method of manufacturing the same.

(b) Description of the Related Art

Recent trends toward lightweight and thin personal computers and televisions require lightweight and thin display devices. Flat panel displays satisfying such a requirement are being substituted for conventional cathode ray tubes ("CRTs").

Flat panel displays include liquid crystal displays ("LCDs"), field emission displays ("FEDs"), organic light emitting diode ("OLED") displays, plasma display panels ("PDPs") and various other types of displays.

Among the flat panel displays, the OLED display is the most promising because of its low power consumption, fast response time, wide viewing angle and high contrast ratio.

An OLED display is a self-emissive display device, which includes two electrodes and an organic light emitting layer interposed therebetween. One of the two electrodes injects holes and the other electrode injects electrons into the light emitting layer. The injected electrons and holes are combined to form excitons, which emit light as a product of their deactivation process.

OLED displays may be divided into passive matrix OLED displays and active matrix OLED displays as determined by the driving method used therein.

The passive matrix type OLED display includes a plurality of anode lines, a plurality of cathode lines intersecting the anode lines and a plurality of pixels, each pixel including a light emission layer. In order to operate the passive matrix type OLED one of the anode lines and one of the cathode lines is selected, which causes light emission in the pixel located at the intersection of the selected signal lines.

The active matrix type OLED display includes a plurality of pixels, each pixel including a switching transistor, a driving transistor and a storage capacitor, as well as an anode, a cathode and a light emission layer. In order to operate the active matrix type OLED, the driving transistor receives a data voltage from the switching transistor and drives a current, having a magnitude depending on the data voltage, into the light emission layer to cause light emission having intensity depending on the current.

In order to maximize the performance of the OLED display, characteristics of the switching thin film transistor and that of the driving thin film transistor, such as turn on voltage, etc., may be different from each other.

In particular, the switching thin film transistor may have good on/off characteristics, and the driving thin film transistor may have high mobility and stability for supplying sufficient currents for driving the OLED.

If the off current of the switching thin film transistor increases, then the data voltage transported to the driving thin film transistor may be reduced and cross-talk between pixels may be generated. If the driving thin film transistor has low mobility and low stability, display characteristics may deteriorate. The deteriorating display characteristics may result in unwanted phenomenon such as a reduction in the current transmitted to the light-emitting device, an image sticking phenomenon, operating life time reduction, etc.

BRIEF SUMMARY OF THE INVENTION

An exemplary embodiment of an organic light emitting diode ("OLED") display according to the present invention includes; a substrate, first and second signal lines which intersect each other and are disposed on the substrate, a switching control electrode connected to the first signal line, a switching input electrode connected to the second signal line, a switching output electrode disposed substantially opposite the switching input electrode with respect to the switching control electrode, a switching semiconductor which partially overlaps the switching input electrode and the switching output electrode, first and second driving control electrodes connected to the switching output electrode, a driving semiconductor disposed between the first and second driving control electrodes, a driving input electrode and a driving output electrode which partially overlap the driving semiconductor and substantially oppose each other with respect to the driving semiconductor, a first electrode connected to the driving output electrode, a second electrode which faces the first electrode, and a light emitting member disposed between the first electrode and the second electrode.

In one exemplary embodiment, the switching semiconductor and the driving semiconductor include different types of crystalline silicon.

In one exemplary embodiment, the switching semiconductor may include an amorphous silicon semiconductor and the driving semiconductor may include one of a microcrystalline silicon semiconductor and a polycrystalline silicon semiconductor.

In one exemplary embodiment, the switching semiconductor and the driving semiconductor may be disposed at different distances from the substrate from each other.

The first driving control electrode may be disposed substantially the same distance form the substrate as the switching control electrode.

In one exemplary embodiment, the second driving control electrode may be disposed substantially the same distance form the substrate as the switching input electrode and the switching output electrode.

In one exemplary embodiment, the OLED display may further include; a first gate insulating layer disposed between the first driving control electrode and the driving semiconductor and a second gate insulating layer disposed between the second driving control electrode and the driving semiconductor.

In one exemplary embodiment, the first gate insulating layer may include silicon oxide and the second gate insulating layer may include silicon nitride.

In one exemplary embodiment, the OLED display may further include a driving voltage line connected to the driving input electrode, and the driving voltage line may overlap at least one of the first driving control electrode and the second driving control electrode.

In one exemplary embodiment, the driving voltage line may be disposed at a different distance from the substrate than the first signal line and the second signal line.

An exemplary embodiment of an OLED display according to the present invention includes; a substrate, first and second signal lines disposed on the substrate, a switching thin film transistor connected to the first and second signal lines, a driving thin film transistor including first and second driving control electrodes connected to the switching thin film transistor and supplied with substantially the same voltage, a first electrode connected to the driving thin film transistor, a second electrode which faces the first electrode, and a light emitting member disposed between the first electrode and the second electrode.

In one exemplary embodiment, the switching thin film transistor may partially overlap the first signal line, the driving thin film transistor may include a driving semiconductor which overlaps the first and second driving control electrodes, and the switching semiconductor and the driving semiconductor include different types of crystalline silicon.

In one exemplary embodiment, the switching semiconductor may include an amorphous silicon semiconductor and the driving semiconductor may include one of a microcrystalline silicon semiconductor and a polycrystalline silicon semiconductor.

In one exemplary embodiment, the driving semiconductor may be formed between the first and second driving control electrodes.

In one exemplary embodiment, the OLED may further include a driving voltage line connected to the driving thin film transistor, and the driving voltage line may overlap at least one of the first driving control electrode and the second driving control electrode.

An exemplary embodiment of a method of manufacturing an OLED display according to the present invention includes; disposing a first signal line including a switching control electrode and a first driving control electrode separated from the first signal line on a substrate, disposing a first gate insulating layer on the first signal line and the first driving control electrode, disposing a driving semiconductor which overlaps the first driving control electrode on the first gate insulating layer, disposing a driving voltage line and a driving output electrode which partially overlap the driving semiconductor on the driving semiconductor and the first gate insulating layer, disposing a second gate insulating layer on the driving voltage line and the driving output electrode, disposing a switching semiconductor which overlaps the switching control electrode on the second gate insulating layer, disposing a data line and a switching output electrode separated form the data line on the switching semiconductor and the second gate insulating layer, disposing a second driving control electrode separated from the data line on the second gate insulating layer, disposing a first electrode connected to the driving output electrode, disposing a light emitting member on the first electrode, and disposing a second electrode on the light emitting member.

In one exemplary embodiment, the disposing the driving semiconductor includes depositing microcrystalline silicon semiconductor.

In one exemplary embodiment, the disposing the driving semiconductor may include depositing amorphous silicon semiconductor and crystallizing the amorphous silicon semiconductor.

In one exemplary embodiment, the crystallizing the amorphous silicon semiconductor includes solid phase crystallization.

In one exemplary embodiment, the method may further include depositing a passivation layer after disposing the data line, the switching output electrode and the second driving control electrode and forming a plurality of contact holes through exposing and developing the passivation layer, and the exposing is performed using a slit mask.

BRIEF DESCRIPTION OF THE DRAWINGS

The foregoing and other aspects, features, and advantages of the present invention will become more apparent from the following detailed description of the present invention when taken in conjunction with the accompanying drawings, in which.

DETAILED DESCRIPTION OF THE INVENTION

Figure 1:
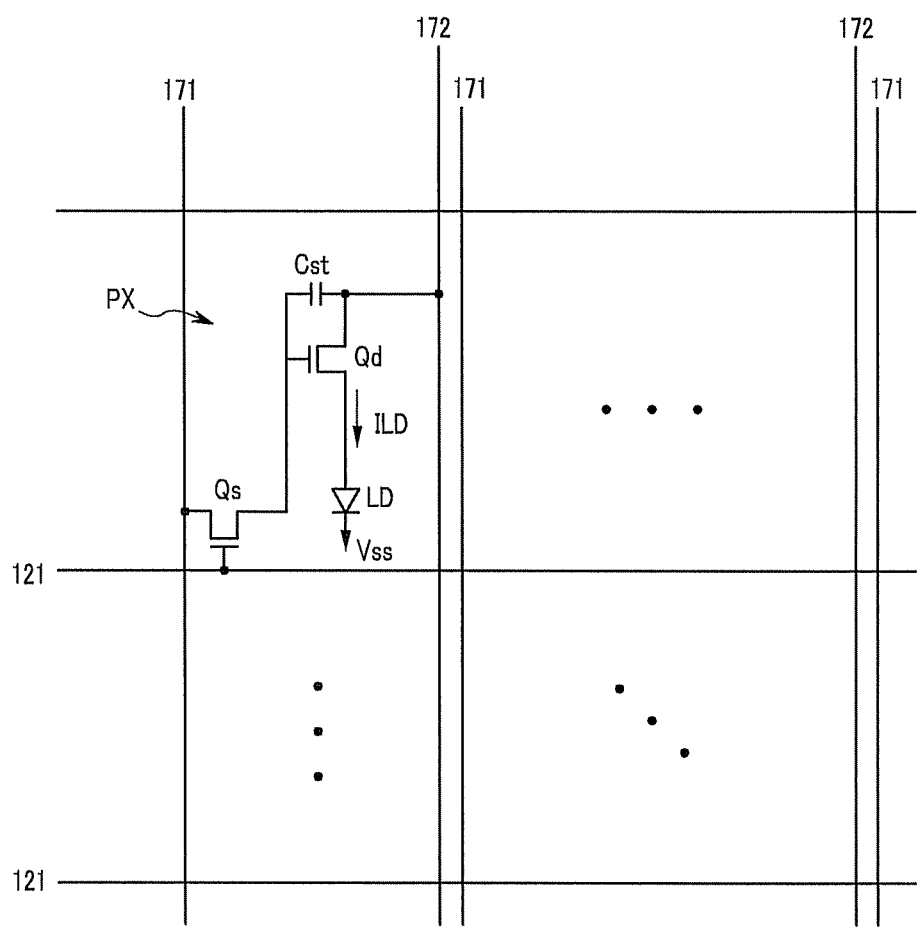
FIG. 1 is an equivalent circuit diagram of an exemplary embodiment of an organic light emitting diode ("OLED") display according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in more detail with reference to the accompanying drawings.

First, an exemplary embodiment of an organic light emitting diode ("OLED") display according to the present invention is described in more detail with reference to FIG. 1.

FIG. 1 is an equivalent circuit diagram of an exemplary embodiment of an OLED display according to the present invention.

Referring to FIG. 1, an exemplary embodiment of an OLED display according to the present invention includes a plurality of signal lines 121, 171 and 172, and a plurality of pixels PX connected thereto and arranged substantially in a matrix.

The signal lines include a plurality of gate lines 121 transmitting gate signals (also called scanning signals), a plurality of data lines 171 transmitting data signals, and a plurality of driving voltage lines 172 transmitting a driving voltage. The gate lines 121 extend substantially in a row direction and are substantially parallel to each other, while the data lines 171 and the driving voltage lines 172 extend substantially in a column direction and are substantially parallel to one another and substantially perpendicular to the gate lines 121.

Each pixel PX includes a switching transistor Qs, a driving transistor Qd, a storage capacitor Cs and an organic light emitting diode LD.

The switching transistor Qs has a control terminal connected to one of the gate lines 121, an input terminal connected to one of the data lines 171, and an output terminal connected to the driving transistor Qd. The switching transistor Qs transmits the data signals applied to the data line 171 to the driving transistor Qd in response to the gate signal applied to the gate line 121.

The driving transistor Qd has a control terminal connected to the switching transistor Qs, an input terminal connected to the driving signal line 172, and an output terminal connected to the OLED LD. The driving transistor Qd drives an output current $I_{LD}$ having a magnitude dependent on the voltage between the control terminal and the output terminal thereof.

The capacitor Cs is connected between the control terminal and the input terminal of the driving transistor Qd. The capacitor Cs stores the data signal applied to the control terminal of the driving transistor Qd and maintains the data signal after the switching transistor Qd turns off.

The OLED LD has an anode connected to the output terminal of the driving transistor Qd and a cathode connected to a common voltage Vss. The OLED LD emits light having an intensity depending on an output current $I_{LD}$ of the driving transistor Qd. The exemplary embodiment of an OLED display comprises a plurality of pixels PX, each one of the pixels capable of being controlled independently. The OLED display then displays images using the light emitted from the plurality of pixels PX. The OLED display may also display moving images by showing a series of images in rapid sequence. Each image in the sequence is then referred to as a single frame.

In the present exemplary embodiment, the switching transistor Qs and the driving transistor Qd are n-channel field effect transistors ("FETs"). However, alternative exemplary embodiments include configurations wherein at least one of the switching transistor Qs and the driving transistor Qd may be a p-channel FET. In addition, alternative exemplary embodiments include configurations wherein the connections among the transistors Qs and Qd, the capacitor Cs, and the OLED LD are variously modified.

A more detailed description of the structure of the exemplary embodiment of an OLED display shown in FIG. 1 according to the present invention will be described with reference to FIGS. 1-3.

Figure 2:
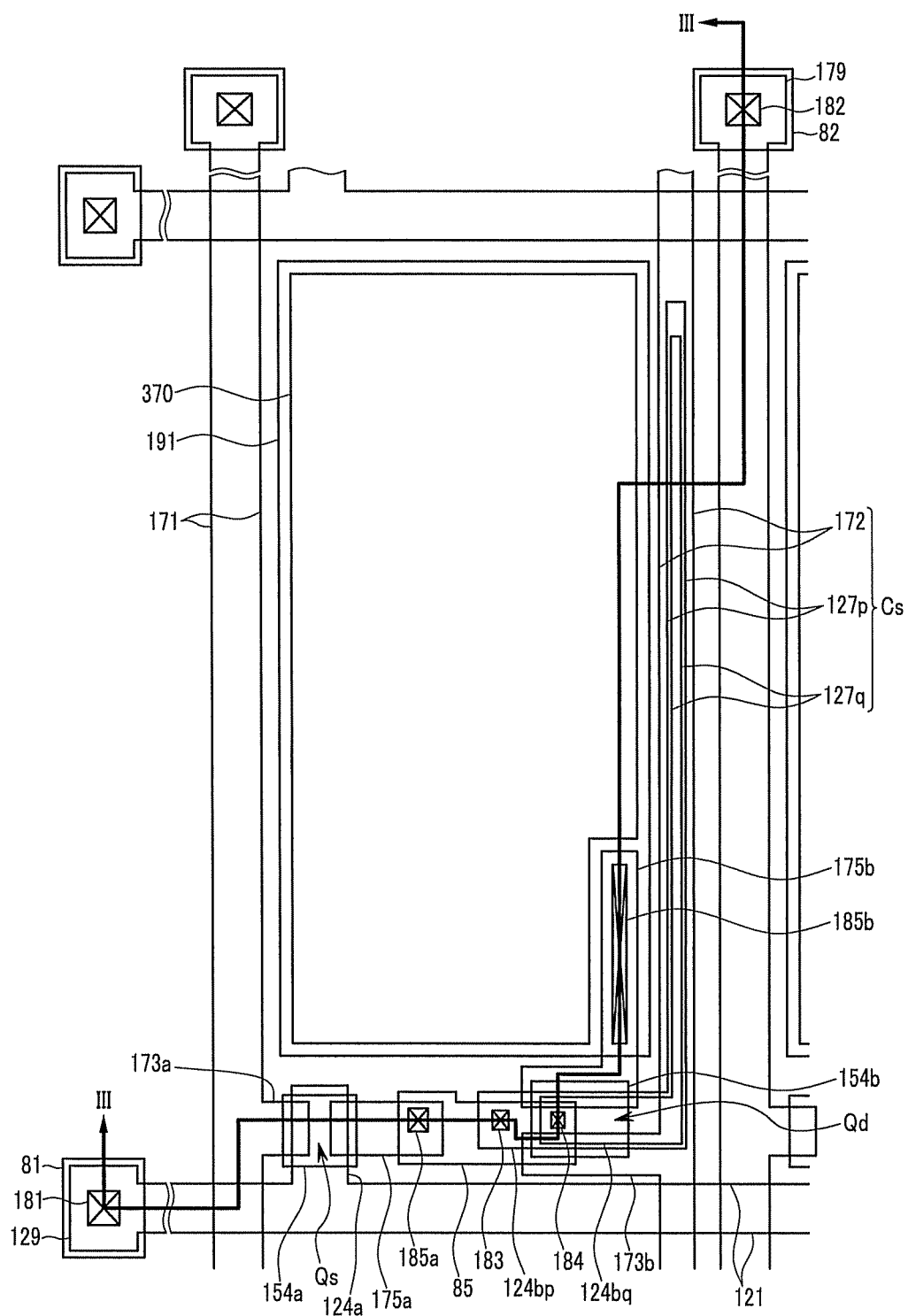
FIG. 2 is a top plan view layout of an exemplary embodiment of an OLED display according to the present invention.
Figure 3:
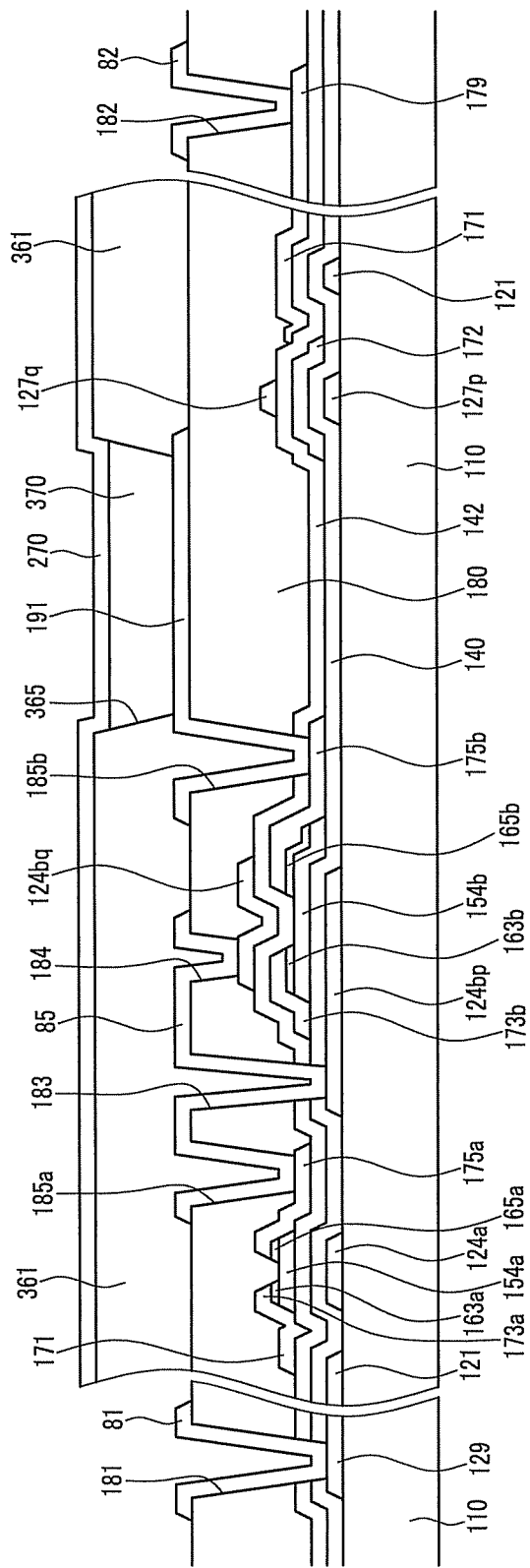
FIG. 3 is a cross-sectional view of the exemplary embodiment of an OLED display shown in FIG. 2 taken along line III-III.

FIG. 2 is a top plan view layout of an exemplary embodiment of an OLED display according to the present invention, and FIG. 3 is a cross-sectional view of the exemplary embodiment of an OLED display shown in FIG. 2 taken along line III-III.

A plurality of gate lines 121 including switching control electrodes 124a, and a plurality of lower driving control electrodes 124*bp* are formed on an insulating substrate 110. Exemplary embodiments of the substrate 110 are made of a material such as transparent glass or plastic.

The gate lines 121 transmit gate signals and extend substantially in a transverse direction. The switching control electrode 124*a* projects away from the gate line 121.

In the present exemplary embodiment, each gate line 121 further includes an end portion 129 having a large area for contact with another layer or an external driving circuit. Alternative exemplary embodiments include configurations wherein the gate line 121 may be directly connected with a driving circuit (not shown) and the end portion 129 may be omitted.

Each lower driving control electrode 124*bp* is separated from the gate lines 121, and includes a lower storage electrode 127*p*, which itself includes a portion extending substantially parallel to the gate line 121 and another portion which extends upward substantially perpendicularly to the gate line 121, as illustrated in FIG. 2.

In exemplary embodiments, the gate lines 121 and the lower driving control electrodes 124*bp* are made of an Al containing metal such as Al or an Al alloy, a Ag containing metal such as Ag or a Ag alloy, a Cu containing metal such as Cu or a Cu alloy, a Mo containing metal such as Mo or a Mo alloy, or the gate lines 121 and lower driving control electrodes may be made from Cr, Ta, Ti, or other similar materials. In an alternative exemplary embodiment, they may have a multi-layered structure including two films having different physical characteristics.

In exemplary embodiments, the lateral sides of the gate lines 121 and the lower driving control electrodes 124*bp* are inclined relative to a surface of the substrate 110, and the inclination angle thereof ranges from about 30 degrees to about 80 degrees.

A lower gate insulating layer 140 is formed on the gate lines 121 and the lower driving control electrodes 124*bp*. Exemplary embodiments of the lower gate insulating layer 140 may be made of silicon nitride ("SiNx") or silicon oxide ("SiOx")

A plurality of driving semiconductors 154*b* are formed on the lower gate insulating layer 140.

Exemplary embodiments of the driving semiconductors 154*b* are made of microcrystalline silicon or polycrystalline silicon. In the present exemplary embodiment, the lower gate insulating layer 140 is made of silicon oxide to improve channel characteristics of the driving transistors.

A plurality of driving voltage lines 172 and a plurality of driving output electrodes 175*b* are formed on the driving semiconductors 154*b* and the lower gate insulating layer 140.

The driving voltage lines 172 transmit driving voltages and extend substantially in the longitudinal direction and intersect the gate lines 121, however, the driving voltage lines 172 and the gate lines 121 are not electrically connected. Each of the driving voltage lines 172 includes a driving input electrode 173*b*, and overlaps the lower storage electrode 127*p*.

The driving output electrodes 175*b* are separated from the driving voltage lines 172.

Each pair of driving input electrode 173*b* and driving output electrode 175*b* are disposed opposite each other with respect to the driving semiconductor 154*b*.

In one exemplary embodiment the driving voltage lines 172 and the driving output electrodes 175*b* may be made of a conductor having a low resistivity, similar to the gate lines 121 and lower driving control electrode 124*bp*.

The driving voltage lines 172 and the driving output electrodes 175*b* have inclined edge profiles, and the inclination angles thereof range from about 30 degrees to about 80 degrees.

A plurality of ohmic contact islands 163*b* and 165*b* are formed between the driving semiconductors 154*b* and the driving input electrodes 173*b* and between the driving semiconductors 154*b* and the driving output electrodes 175*b*, respectively. In exemplary embodiments, the ohmic contacts 163*b* and 165*b* are made of silicide or n+ hydrogenated a-Si, microcrystalline silicon, or polycrystalline silicon heavily doped with an n-type impurity such as phosphorous.

An upper gate insulating layer 142 is formed on the driving voltage lines 172 and the driving output electrodes 175*b*. In one exemplary embodiment the upper gate insulating layer 142 may be made of silicon oxide or silicon nitride, or other similar materials.

A plurality of switching semiconductors 154*a* are formed on the upper gate insulating layer 142.

The switching semiconductors 154*a* overlap the switching control electrodes 124*a*.

In one exemplary embodiment, the switching semiconductors 154*a* are made of hydrogenated amorphous silicon. In such an exemplary embodiment, the upper gate insulating layer 142 is made of silicon nitride to enhance channel characteristics of the switching transistors 154*a*.

A plurality of data lines 171, a plurality of switching output electrodes 175*a* and a plurality of upper driving control electrodes 124*bq* are formed on the switching semiconductors 154*a* and the upper gate insulating layer 142.

The data lines 171 transmit data signals and extend substantially in the longitudinal direction and intersect, but are not electrically connected to, the gate lines 121, as illustrated in FIG. 2. The data lines 171 are formed on a different layer from the gate lines 121 and the driving voltage lines 172 to prevent a short therebetween, as illustrated in FIG. 3.

Each data line 171 includes a switching input electrode 173*a* extending toward the switching control electrode 124*a*. In one exemplary embodiment, an end portion 179 is included on the data line 171, wherein the end portion 179 includes a large area for contact with another layer or an external driving circuit. In an alternative exemplary embodiment, the data lines 171 may extend to be directly connected to a data driving circuit (not shown) for generating the data signals, which may be integrated on the substrate 110.

The switching output electrodes 175*a* are separated from the data lines 171.

Each pair of switching input electrode 173*a* and switching output electrode 175*a* are disposed opposite each other with respect to the switching semiconductor 154*a*.

The upper driving control electrodes 124*bq* are separated from the data lines 171 and the switching output electrodes 175*a*, and overlap the driving semiconductors 154*b*.

In one exemplary embodiment, the data lines 171, the switching output electrodes 175*a* and the upper driving control electrodes 124*bq* may be made of a conductor having a low resistivity, similar to the gate lines 121.

In exemplary embodiments, the data lines 171, the switching output electrodes 175*a* and the upper driving control electrodes 124*bq* have inclined edge profiles, and the inclination angles thereof range from about 30 degrees to about 80 degrees.

A passivation layer 180 is formed on the data lines 171, the switching output electrodes 175*a* and the upper driving control electrodes 124*bq*.

The passivation layer 180 includes a plurality of contact holes 182, 184 and 185*a* exposing the end portions 179 of the data lines 171, the upper driving control electrodes 124bq and the switching output electrodes 175a, respectively. The passivation layer 180 and the upper gate insulating layer 142 includes a plurality of contact holes 185b exposing the driving output electrodes 175b. The passivation layer 180, the upper gate insulating layer 142, and the lower gate insulating layer 140 include a plurality of contact holes 181 and 183 exposing the end portions 129 of the gate lines 121 and the lower driving control electrodes 124bp, respectively.

A plurality of pixel electrodes 191, a plurality of connecting members 85, and a plurality of contact assistants 81 and 82 are formed on the passivation layer 180.

The pixel electrodes 191 are electrically connected to the driving output electrodes 175b at least through the contact holes 185b.

The plurality of connecting members 85 are connected to the switching output electrode 175a, the lower driving control electrode 124bp, and the upper driving control electrode 124bq through the contact holes 185a, 183 and 184, respectively.

The contact assistants 81 and 82 are connected to the end portion of the gate line 121 and the end portion of the data line 171 through the contact holes 181 and 182, respectively. The contact assistants 81 and 82 protect the end portions 129 and 179 and complement the adhesion between the end portions 129 and 179 and external devices (not shown) connected thereto.

In one exemplary embodiment the pixel electrodes 191, the connecting members 85, and the contact assistants 81 and 82 may be made of a transparent conductor. Exemplary embodiments of the transparent conductor include indium tin oxide ("ITO") or indium zinc oxide ("IZO"). The pixel electrodes 191, the connecting members 85, and the contact assistants 81 and 82 including a transparent conductor are especially useful in a bottom emission type display where the light from a light emitting member 370 passes through the pixel electrode 191 to an outside. In an alternative exemplary embodiment, the pixel electrode 191, the connecting members 85 and the contact assistants 81 and 82 may be made of an opaque conductor, exemplary embodiments of which include Al or an Al alloy, or Au, Pt, Ni, Cu, or W having a large work function or an alloy thereof. The pixel electrodes 191, the connecting members 85, and the contact assistants 81 and 82 including a transparent conductor are especially useful in a top emission type display where the light from a light emitting member 370 passes through a common electrode 270 to an outside.

A partition 361 is formed on the passivation layer 180, the pixel electrodes 191, the connecting members 85, and the contact assistants 81 and 82. The partition 361 surrounds the pixel electrodes 191 like a bank to define openings 365. In one exemplary embodiment, the partition 361 may be made of an organic insulator, such as acrylic resin and polyimide resin, having heat-resistant and dissolvent properties, or an inorganic insulator, exemplary embodiments of which include silicon oxide ("SiO$_2$") and titanium oxide ("TiO$_2$"). In an alternative exemplary embodiment the partition 361 may have a multi-layered structure. In one exemplary embodiment the partition 361 may be made of a photosensitive material containing black pigment so that the black partition 361 may serve as a light blocking member and the formation of the partition 361 may be simplified.

A plurality of the light emitting members 370 are formed on the pixel electrodes 191 and confined in the openings 365 defined by the partition 361.

Each of the light emitting members 370 may have a multi-layered structure including an emitting layer (not shown) for emitting light and auxiliary layers (not shown) for improving the efficiency of light emission of the emitting layer.

In exemplary embodiments, each of the light emitting members 370 is made of a high molecular weight compound, a low molecular weight compound, or a mixture thereof uniquely emitting light of one of the primary colors, such as red, green, and blue. Exemplary embodiments of the high molecular weight compound may include a polyfluorene derivative, a (poly) paraphenylenevinylene derivative, a polyphenylene derivative, a polyfluorene derivative, polyvinylcarbazole, or a polythiophene derivative, and exemplary embodiments of the low molecular weight compound may include anthracene such as 9,10-diphenylanthracene, a butadiene such as tetraphenylbutadiene, a tetracene, a distyrylarylene derivative, a benzazole derivative, or a carbazole derivative.

Additionally, in one exemplary embodiment a dopant such as xanthene, perylene, cumarine, rhodamine, rubrene, a dicyanomethylenepyran compound, a thiopyran compound, a (thia)pyrilium compound, a periflanthene derivative, an indenoperylene derivative, a carbostyryl compound, Nile red and quinacridone, may be doped to the low or high molecular weight compound as a host material to increase the light emitting efficiency thereof. According to the present exemplary embodiment the OLED display displays images by spatially adding the monochromatic primary color lights emitted from the light emitting members 370. In an alternative exemplary embodiment the emitting layer emits white light which is then transformed into one of the monochromatic primary colors by the addition of a color filter layer (not shown) between the emitting layer and the outside. In yet another exemplary embodiment the OLED display displays images by chronologically adding the monochromatic primary colors emitted from the light emitting members 370.

The auxiliary layers may include an electron transport layer (not shown) and a hole transport layer (not shown) for improving the balance of the electrons and holes in the emitting layer, an electron injecting layer (not shown) and a hole injecting layer (not shown) for improving the injection of the electrons and holes. In one exemplary embodiment the hole transport layer and the hole injecting layer may be made of a material having a work function between that of the pixel electrodes 191 and that of the emission layer, and in one exemplary embodiment the electron transport layer and the electron injecting layer may be made of a material having a work function between that of a common electrode 270 and that of the emission layer. In one exemplary embodiment, the hole transport layer and the hole injecting layer may be made of a compound such as a diamine compound, MTDATA [4,4', 4"-tris(3-menthylphenyl) phenylamino]triphenylamine, TPD (N,N'-diphenyl-N,N'-di(3-menthylphenyl)-1,1'-biphenyl-4, 4'-diamine), 1,1-bis(4-di-p-tolylaminophenyl)cyclohexane, N,N,N'N'-tetra(2-naphthyl)-4,4-diamino-p-terphenyl, 4,4',4-tris[(3-methylphenyl)phenylamino]triphenylamine, polypyrrole, polyaniline, poly-(3,4-ethylenedioxythiophene):polystyrene sulfonate ("PEDOT:PSS").

In one exemplary embodiment, as briefly described above, the light emitting members 370 which uniquely emit light of one of the primary colors, e.g., red, green, and blue, are respectively arranged within each pixel with vertical or horizontal disposition to form a white emitting layer under or above the color filters (not shown) in order to emit light of one of the primary colors. Here, the color filters (not shown) may be disposed under the emitting layer in a bottom emission type display, and the color filters may be disposed on the emitting layer in a top emission type display.

Furthermore, in one exemplary embodiment of the OLED display device the luminance can be improved by further including a white pixel (W) as well as the red, green, and blue pixels (R, G, and B) wherein the four different types of pixels are arranged in a striped or checked pattern.

The common electrode 270 is formed on the light emitting members 370 and the partition 361. The common electrode 270 is formed on substantially the whole of the substrate 110, and supplies a voltage to the light emitting members 370, which in cooperation with the voltage supplied through the pixel electrodes 191, sends currents to the light emitting members 370.

In the above-described exemplary embodiment of an OLED display, a switching control electrode 124a connected to a gate line 121, a switching input electrode 173a connected to a data line 171, and a switching output electrode 175a along with a switching semiconductor 154a form a switching TFT Qs including a channel formed in the switching semiconductor 154a disposed between the switching input electrode 173a and the switching output electrode 175a.

Similarly, a lower driving control electrode 124bp and an upper driving control electrode 124bq connected to a switching output electrode 175a, a driving input electrode 173b connected to a driving voltage line 172, and a driving output electrode 175b connected to a pixel electrode 191 along with driving semiconductor 154b form a driving TFT Qd including a channel formed in the driving semiconductor 154b disposed between the driving input electrode 173b and the driving output electrode 175b.

As described above, the exemplary embodiment of an OLED display includes the driving TFT Qd having the driving semiconductor 154b, and the lower driving control electrode 124bp and the upper driving control electrode 124bq overlapping the driving semiconductor 154b over and below the driving semiconductor 154b, respectively. Accordingly, two driving control electrodes 124bp and 124bq of the driving TFT Qd are disposed over and below one driving semiconductor 154b, respectively, and therefore charge carriers going through the channels of the driving TFT Qd increase by about a factor of two to increase the driving current by a similar amount, even though the area of the driving TFT Qd remains relatively small. Therefore, the driving current of the driving TFT Qd may increase by about two times and the aperture ratio of a pixel in the exemplary embodiment of an OLED is not decreased.

As described above, the switching semiconductor 154a of the present exemplary embodiment of an OLED display is made of amorphous silicon, while the driving semiconductor 155b of the OLED display according to the present exemplary embodiment is made of microcrystalline silicon or polycrystalline silicon. Therefore, the channel of the switching TFT Qs includes amorphous silicon, while the channel of the driving TFT Qd includes microcrystalline silicon or polycrystalline silicon.

In one exemplary embodiment the driving TFT Qd may include a channel of microcrystalline silicon or polycrystalline silicon which provides the driving TFT Qd with carrier mobility and stability. Accordingly, due to the high carrier mobility and stability there is an increase in the current flowing in the driving TFT Qd which enhances luminance of the exemplary embodiment of an OLED of the present invention. Also, the threshold voltage shift phenomenon caused by applying a constant positive driving voltage in an OLED may be excluded and therefore an image sticking phenomenon is not generated and the life-time of the OLED can be extended.

Meanwhile, in the present exemplary embodiment the channel of the switching TFT Qs includes amorphous silicon having a low off current. Accordingly the on/off characteristics of the switching TFT Qs for controlling the data voltage, particularly reduction of the current which passes through the switching TFT Qs when the scanning signal is not applied to its control terminal (hereinafter referred to as the off current), may be maintained. If the off current is held at a steady level a reduction in the data voltage due to a high off current may be prevented and the cross talk phenomenon of the OLED may be reduced.

As described above, the switching TFT Qs and the driving TFT Qd of the present exemplary embodiment of an OLED display include channels made of different materials in order to satisfy the desired characteristics for the switching TFT and the driving TFT.

Although the present exemplary embodiment of an OLED display includes a plurality of pixels having one switching TFT Qs and one driving TFT Qd, alternative exemplary embodiments include configurations wherein other TFTs and wiring for driving them may be included to prevent the driving TFT Qd from degrading and the lifetime of the OLED display from shortening.

The pixel electrode 191, the light emitting member 370 and the common electrode 270 form an OLED LD having the pixel electrode 191 as an anode and the common electrode 270 as a cathode or vice versa.

The overlapping portions of the driving voltage line 172 and the lower and upper storage electrodes 127p and 127q form a storage capacitor Cs. Here, the driving voltage line 172 overlaps the lower storage electrode 127p and the upper storage electrode 127q therebelow and thereover, respectively. In this configurations the capacitance of the storage capacitor Cs may be increased by about two times even though the aperture ratio of the exemplary embodiment of an OLED display is not decreased.

Now, a method of manufacturing the exemplary embodiment of an OLED display shown in FIG. 2 and FIG. 3 is described with reference to FIG. 4 through FIG. 17 along with FIG. 2 and FIG. 3.

FIG. 4, FIG. 6, FIG. 8, FIG. 10, FIG. 12, FIG. 14, and FIG. 16 are top plan view layouts of the exemplary embodiment of an OLED display shown in FIG. 2 and FIG. 3 in intermediate steps of an exemplary embodiment of a method of manufacturing thereof according to the present invention. FIG. 5 is a cross-sectional view of the exemplary embodiment of an OLED display shown in FIG. 4 taken along line V-V, FIG. 7 is a cross-sectional view of the exemplary embodiment of an OLED display shown in FIG. 6 taken along line VII-VII, FIG. 9 is a cross-sectional view of the exemplary embodiment of an OLED display shown in FIG. 8 taken along line IX-IX, FIG. 11 is a cross-sectional view of the exemplary embodiment of an OLED display shown in FIG. 10 taken along line XI-XI, FIG. 13 is a cross-sectional view of the exemplary embodiment of an OLED display shown in FIG. 12 taken along line XIII-XIII, FIG. 15 is a cross-sectional view of the exemplary embodiment of an OLED display shown in FIG. 14 taken along line XV-XV, and FIG. 17 is a cross-sectional view of the exemplary embodiment of an OLED display shown in FIG. 16 taken along line XVII-XVII.

Figure 4:
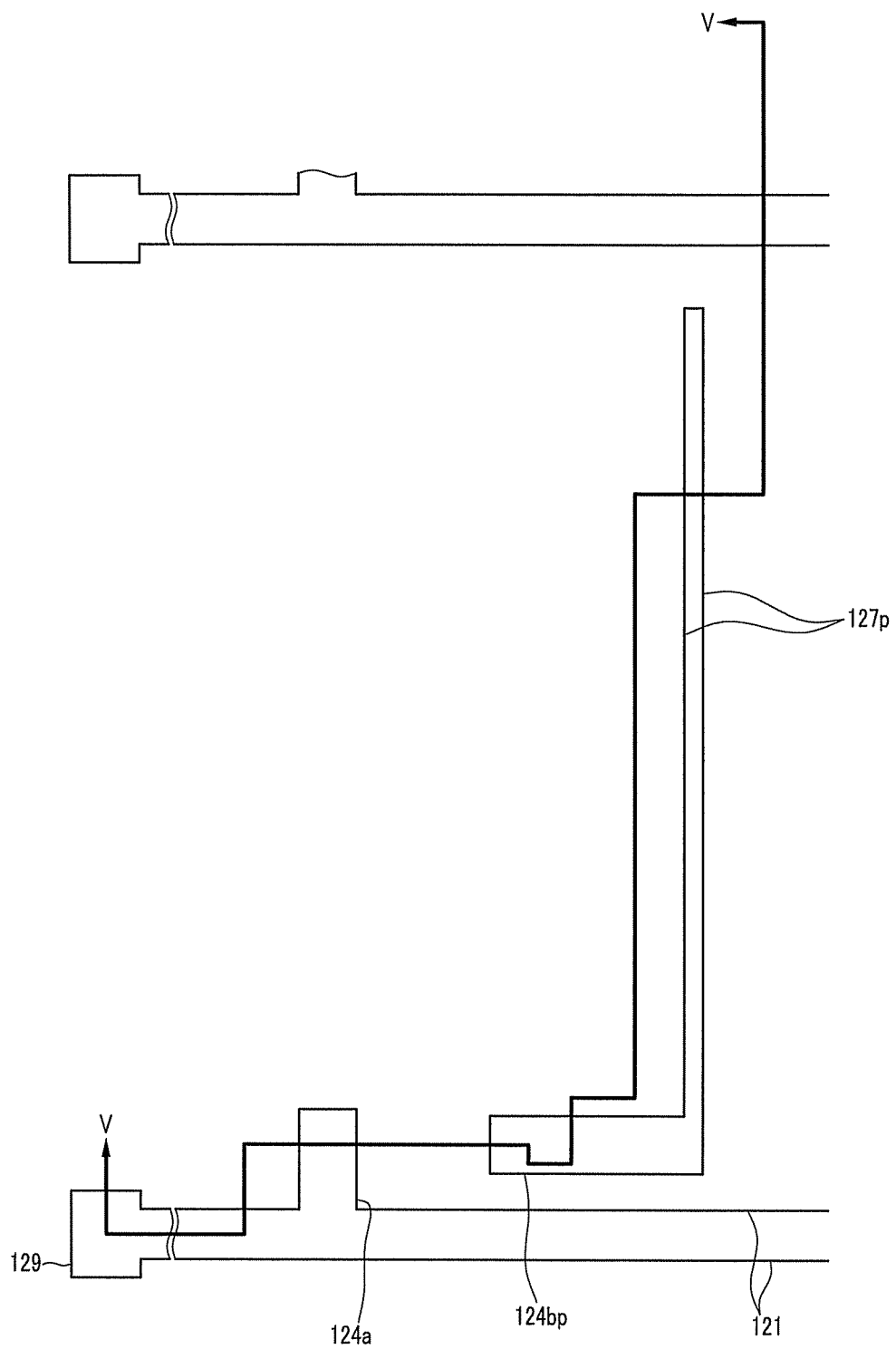
FIG. 4, FIG. 6, FIG. 8, FIG. 10, FIG. 12, FIG. 14, and FIG. 16 are top plan layout views of the exemplary embodiment of an OLED display shown in FIG. 2 and FIG. 3 in intermediate steps of an exemplary embodiment of a method of manufacturing thereof according to the present invention.
Figure 5:
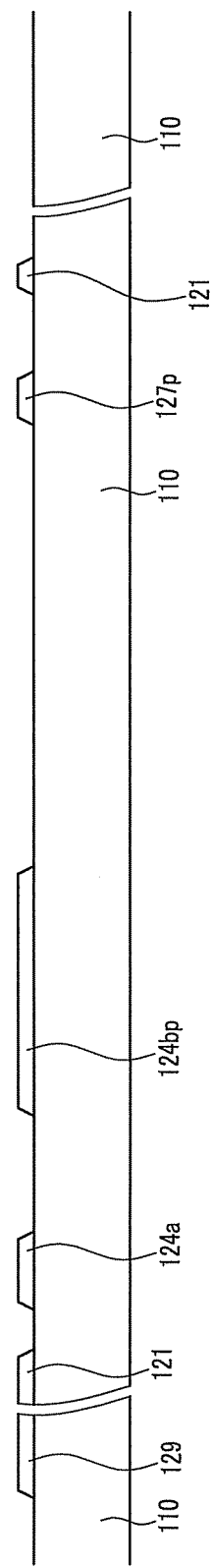
FIG. 5 is a cross-sectional view of the exemplary embodiment of an OLED display shown in FIG. 4 taken along line V-V.

As shown in FIG. 4 and FIG. 5, a plurality of gate lines 121 including a plurality of switching control electrodes 124a and a plurality of end portions 129, and a plurality of lower driving control electrodes 124bp including a plurality of lower storage electrodes 127p are formed on an insulating substrate 110, exemplary embodiments of which are made of a material such as transparent glass or plastic.

Figure 6:
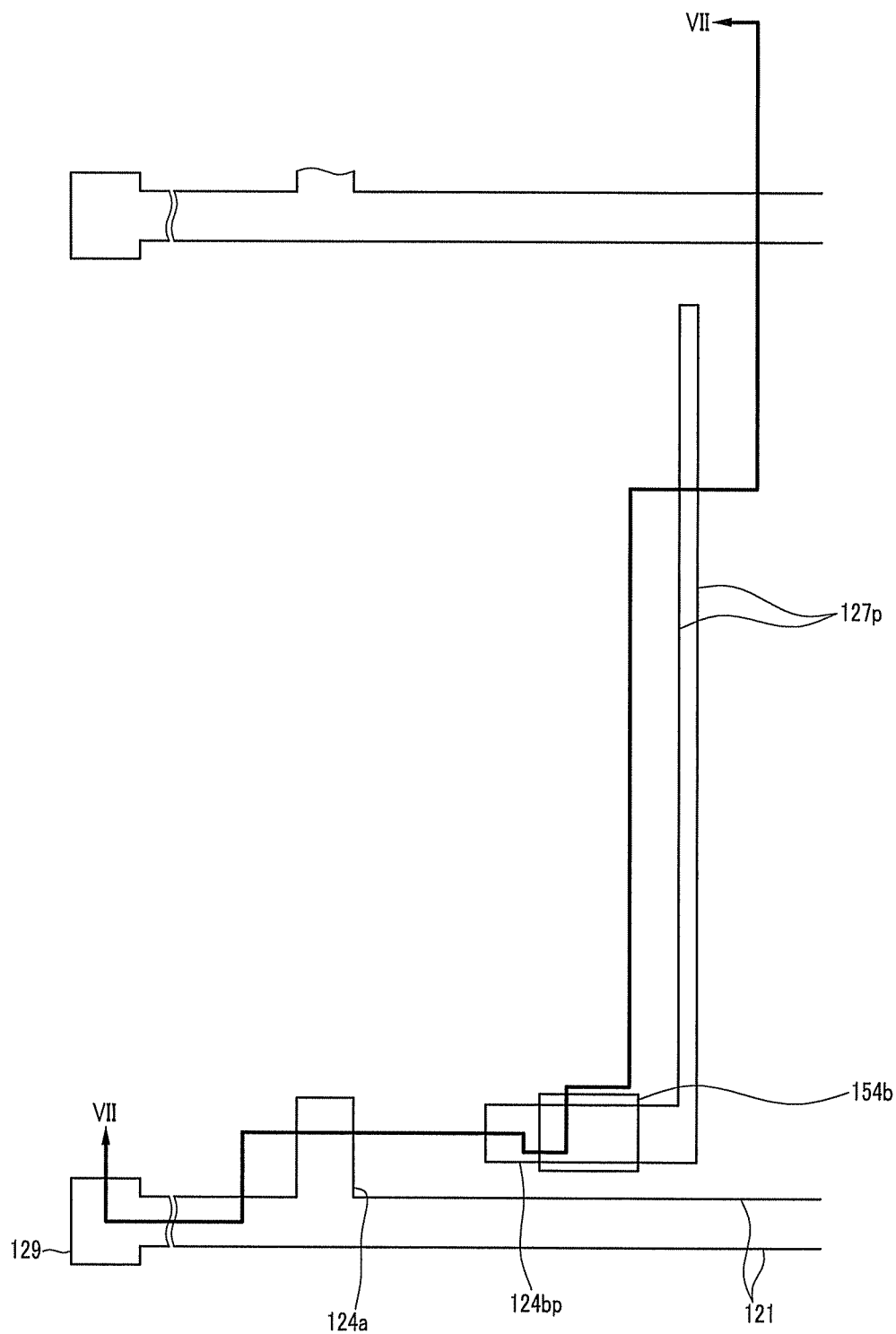
Figure 7:
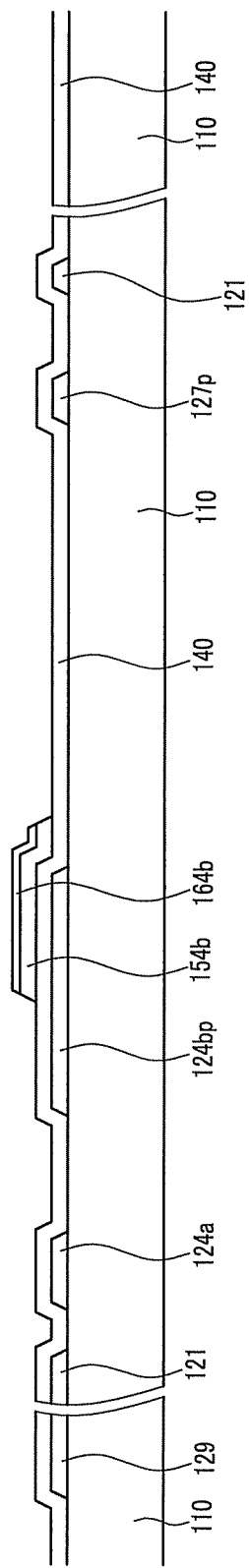
FIG. 7 is a cross-sectional view of the exemplary embodiment of an OLED display shown in FIG. 6 taken along line VII-VII.

Referring to FIG. 6 and FIG. 7, an lower gate insulating layer 140, a microcrystalline silicon layer, and an impurity amorphous silicon layer are sequentially deposited on the substrate 110 having the gate lines 121 and lower driving control electrodes 124bp, and then the microcrystalline silicon layer and the impurity amorphous silicon layer are patterned, exemplary embodiments of the patterning methods may include photolithography and etching, to form a plurality of driving semiconductor islands 154b and a plurality of ohmic contact layer islands 164b on the lower gate insulating layer 140. Here, the lower gate insulating layer 140, the microcrystalline silicon layer, and the impurity amorphous silicon layer are sequentially deposited such that each the interface between the layers is stably maintained, and the driving semiconductors 154b and the ohmic contact layers 164b have an island shape to reduce stress between these layers and other layers to be formed thereafter.

Alternatively, the lower gate insulating layer 140, the amorphous silicon layer, and the impurity amorphous silicon layer are sequentially deposited on the substrate 110 having the gate lines 121 and the lower driving control electrodes 124bp, and then the amorphous silicon layer and the impurity amorphous silicon layer are crystallized. Here, exemplary embodiments of the crystallization include solid phase crystallization ("SPC"), rapid thermal annealing ("RTA"), liquid phase recrystallization ("LPR"), excimer laser annealing ("ELA") and various other similar techniques.

Figure 8:
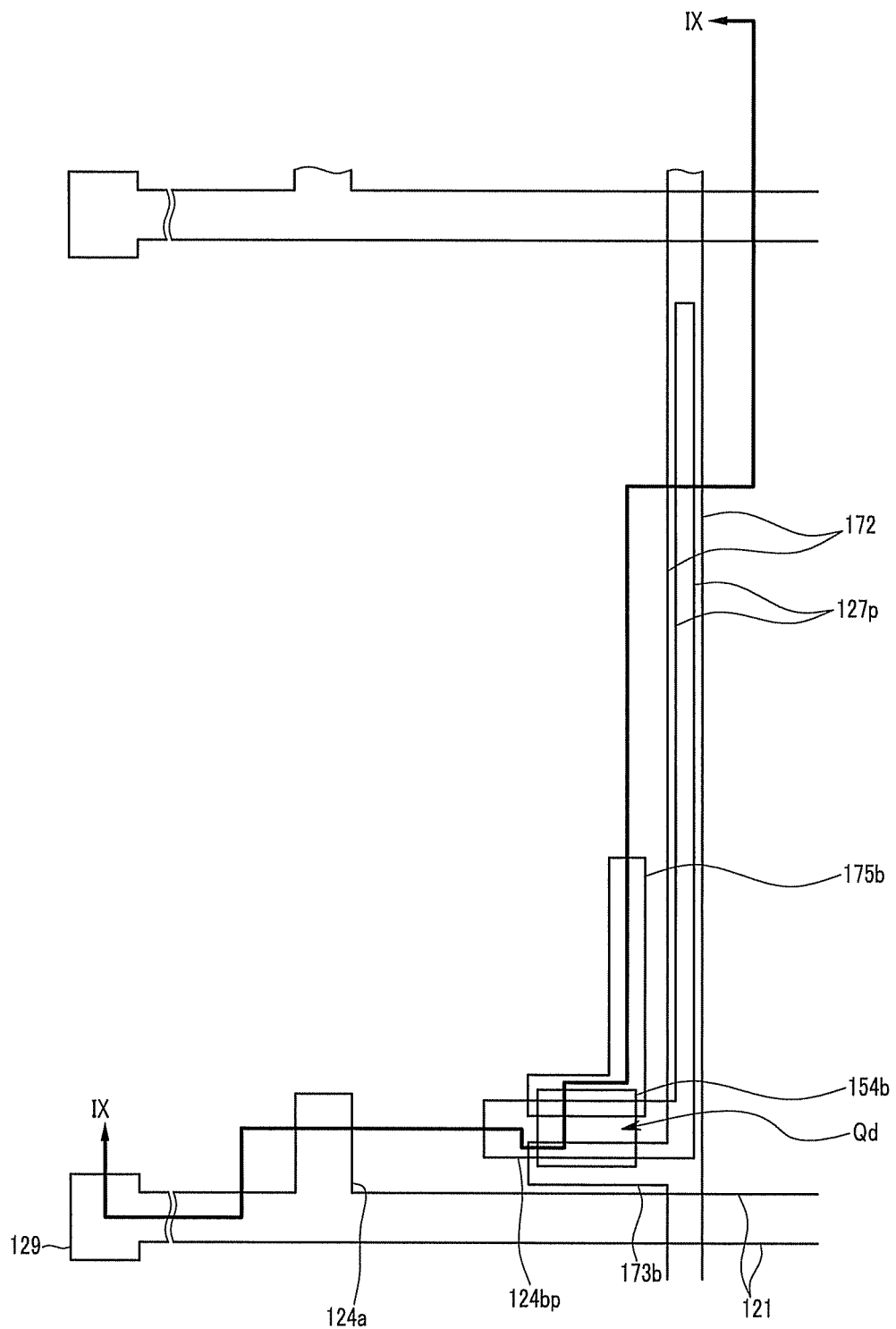
Figure 9:
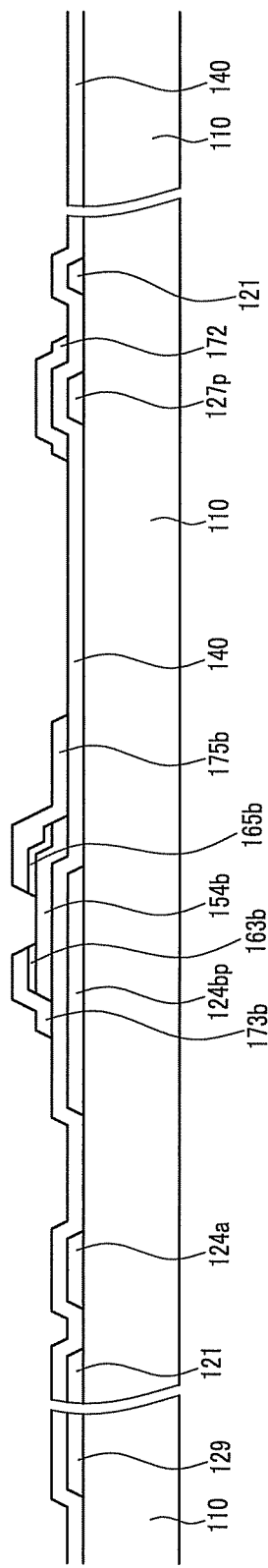
FIG. 9 is a cross-sectional view of the exemplary embodiment of an OLED display shown in FIG. 8 taken along line IX-IX.

Next, a metal layer is deposited on the lower gate insulating layer 140 the ohmic contact layers 164b, and the exposed portions of the driving semiconductor islands 154b, and is then patterned, in one exemplary embodiment by photolithography and etching, to form a plurality of driving output electrodes 175b and a plurality of driving voltage lines 172 including a plurality of driving input electrodes 173b as shown in FIG. 8 and FIG. 9.

Thereafter, exposed portions of the ohmic contact layers 164b, which are not covered with the driving voltage lines 172 and the driving input and output electrodes 173b and 175b, respectively, are removed to form a plurality pairs of ohmic contacts 163b and 165b.

Figure 10:
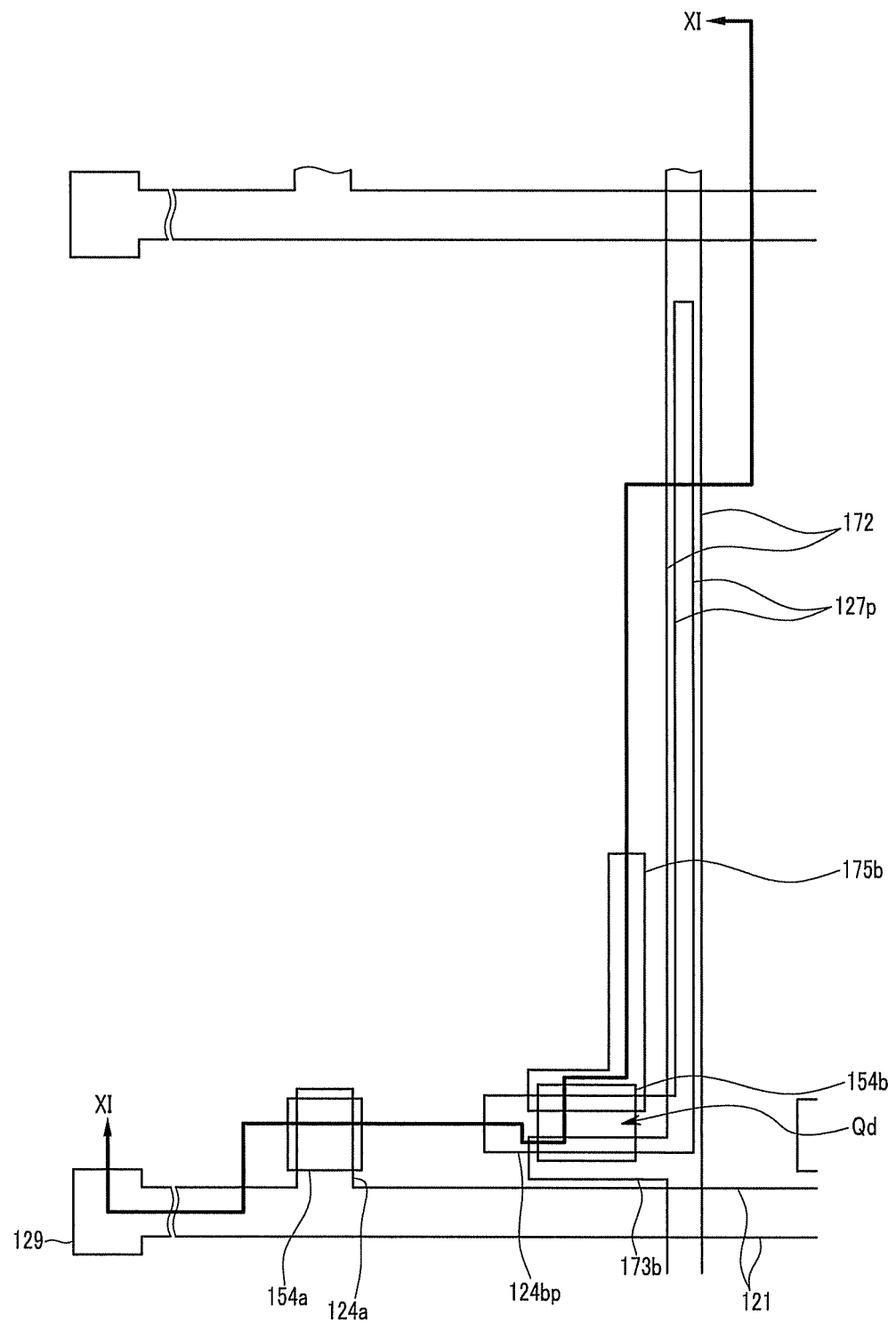
Figure 11:
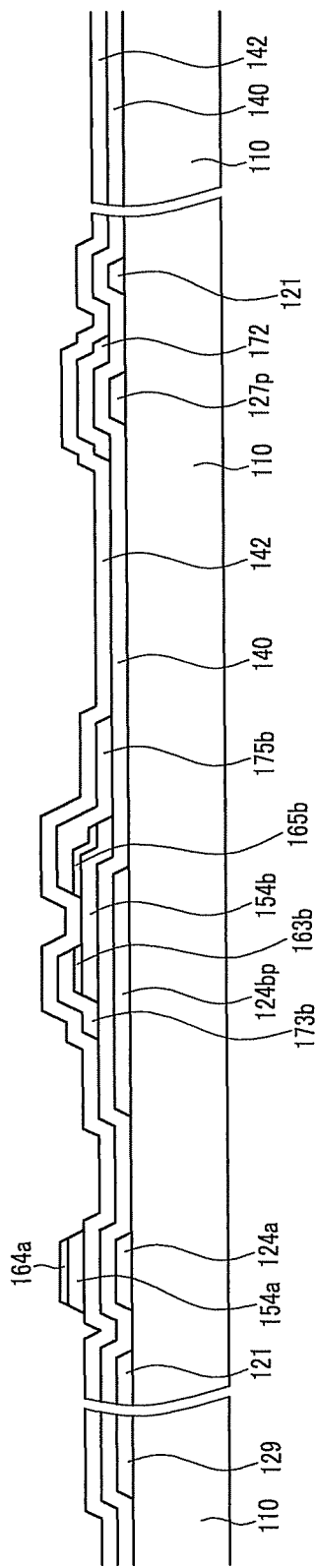
FIG. 11 is a cross-sectional view of the exemplary embodiment of an OLED display shown in FIG. 10 taken along line XI-XI.

An upper gate insulating layer 142, an intrinsic amorphous silicon layer, and an impurity amorphous silicon layer are deposited on the driving voltage lines 172, the driving input and output electrodes 173b and 175b, respectively, and the lower gate insulating layer 140, and then the intrinsic amorphous silicon layer and the impurity amorphous silicon layer are patterned, in one exemplary embodiment by photolithography and etching, to form a plurality of switching semiconductors 154a and a plurality of ohmic contact layers 164a as shown in FIG. 10 and FIG. 11. Here, the upper gate insulating layer 142, the intrinsic amorphous silicon layer, and the impurity amorphous silicon layer are sequentially deposited such that each interface between the layers is stably maintained, and the switching semiconductors 154a and the ohmic contact layers 164a have an island shape to reduce stress between these layers and other layers to be formed thereafter.

Figure 12:
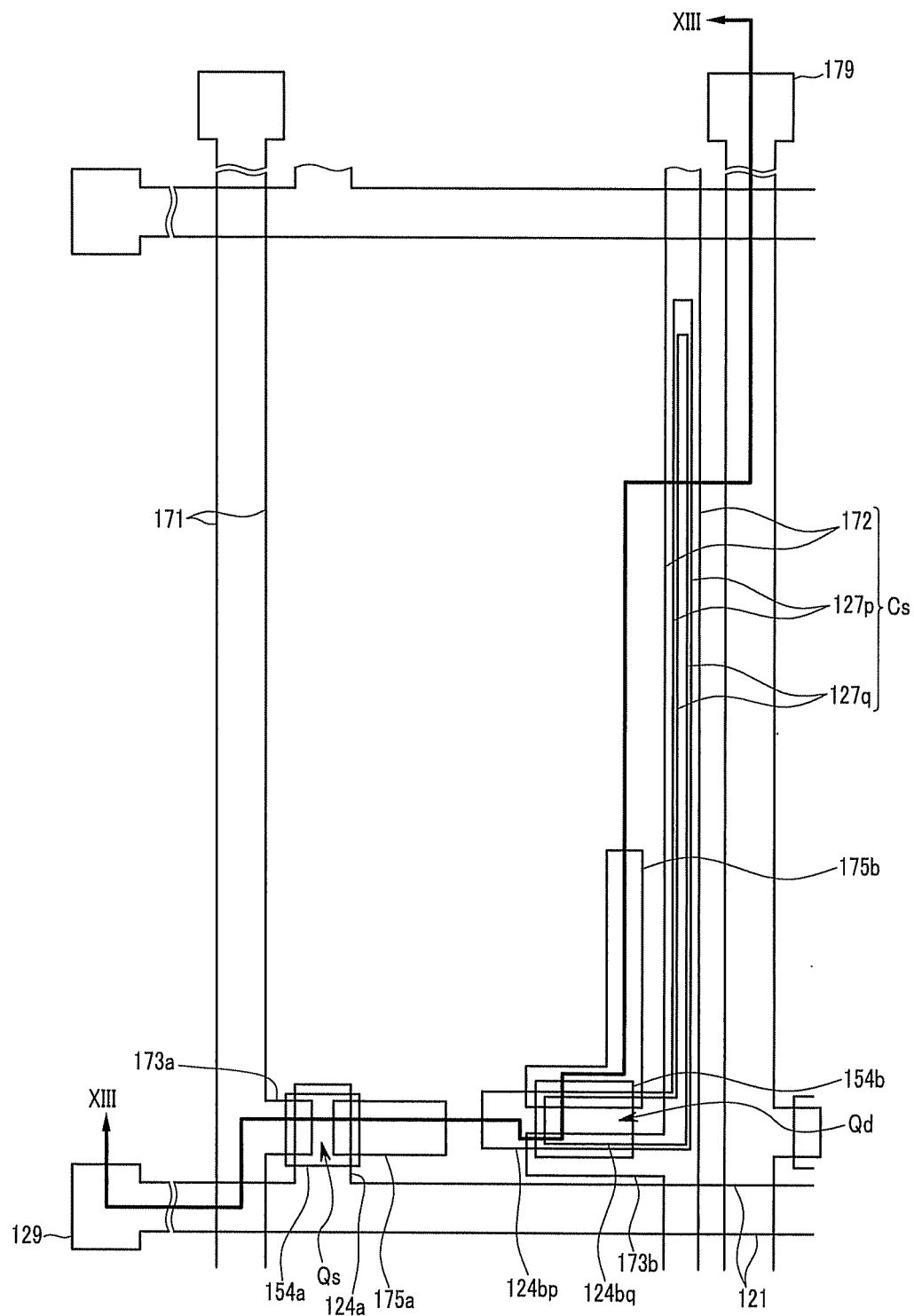
Figure 13:
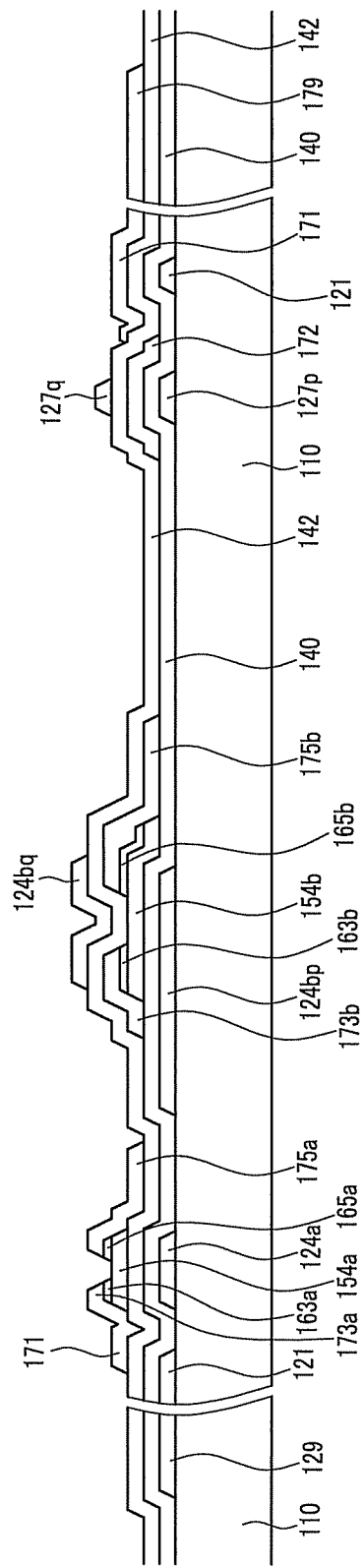
FIG. 13 is a cross-sectional view of the exemplary embodiment of an OLED display shown in FIG. 12 taken along line XIII-XIII.

Next, a metal layer is deposited on the upper gate insulating layer 142 and the ohmic contact layers 164a and patterned, in one exemplary embodiment by photolithography and etching, to form a plurality of switching output electrodes 175a and a plurality of data lines 171 including a plurality of switching input electrodes 173a and a plurality of end portions 179 as shown in FIG. 12 and FIG. 13.

Thereafter, exposed portions of the ohmic contact layers 164a, which are not covered with the data lines 171 and the switching output electrodes 175a, are removed to complete a plurality of pairs of ohmic contacts 163a and 165a.

Figure 14:
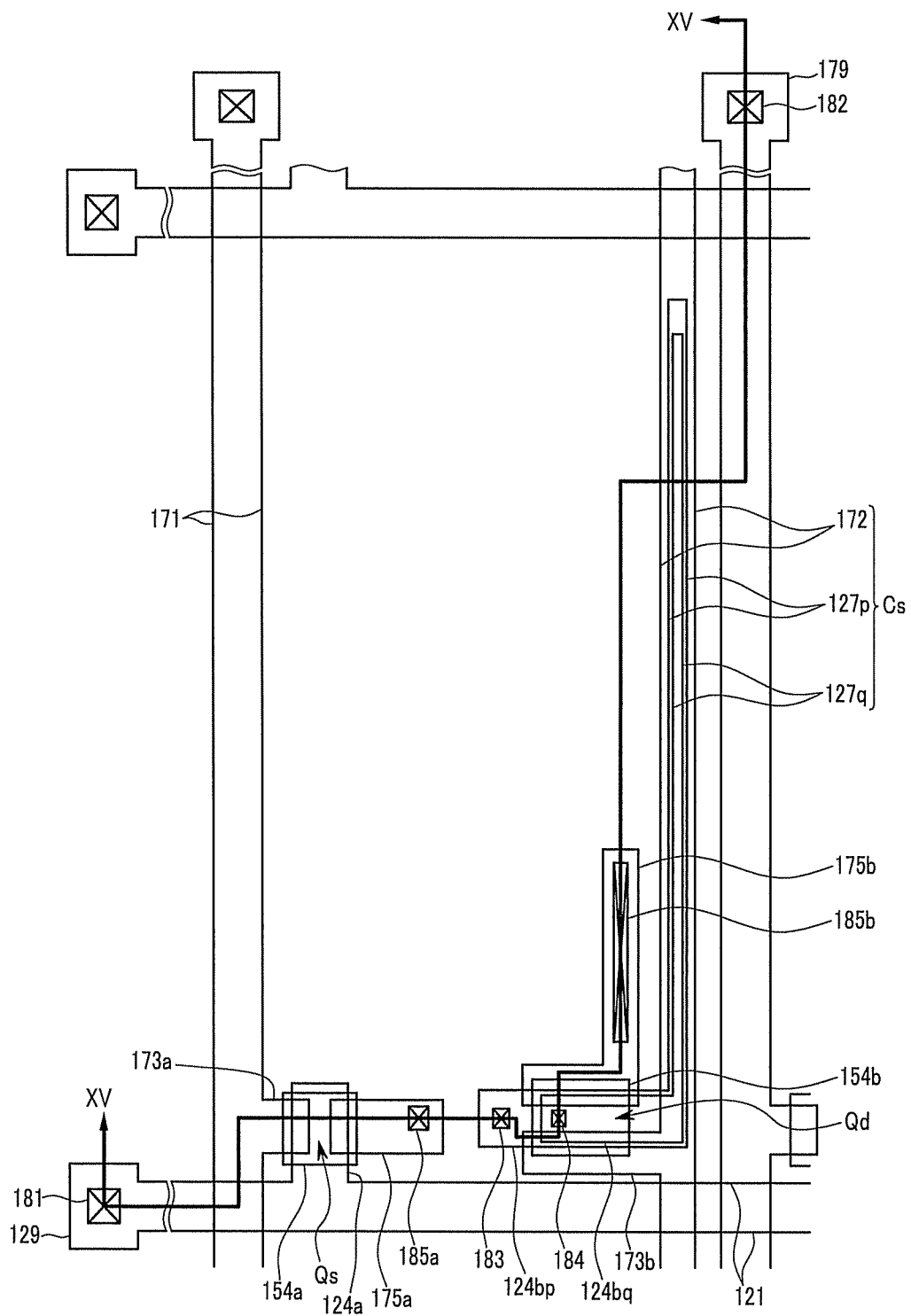
Figure 15:
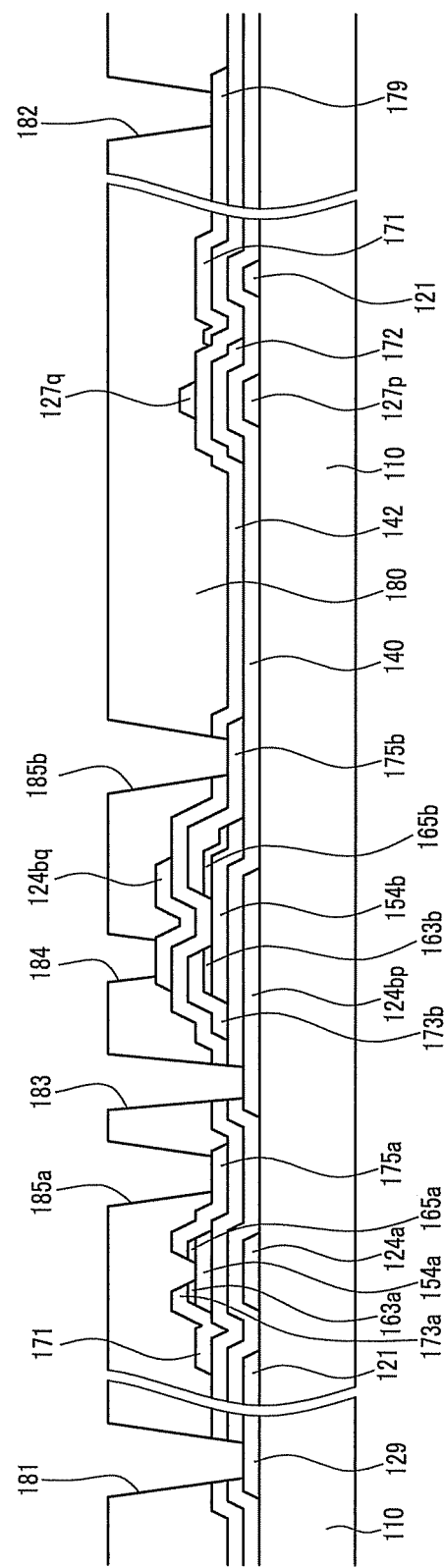
FIG. 15 is a cross-sectional view of the exemplary embodiment of an OLED display shown in FIG. 14 taken along line XV-XV.

Referring FIG. 14 and FIG. 15, a passivation layer 180 is deposited on substantially the whole substrate 110 and is patterned, in one exemplary embodiment by photolithography, along with the upper gate insulating layer 142 to form a plurality of contact holes 181, 182, 183, 184, 185a and 185b. In the present exemplary embodiment, a slit mask is used in the photolithography process to pattern the passivation layer 180, the upper gate insulating layer 142, and the lower gate insulating layer 140 to form the contact holes 181, 182, 183, 184, 185a and 185b using one photomask substantially simultaneously.

Figure 16:
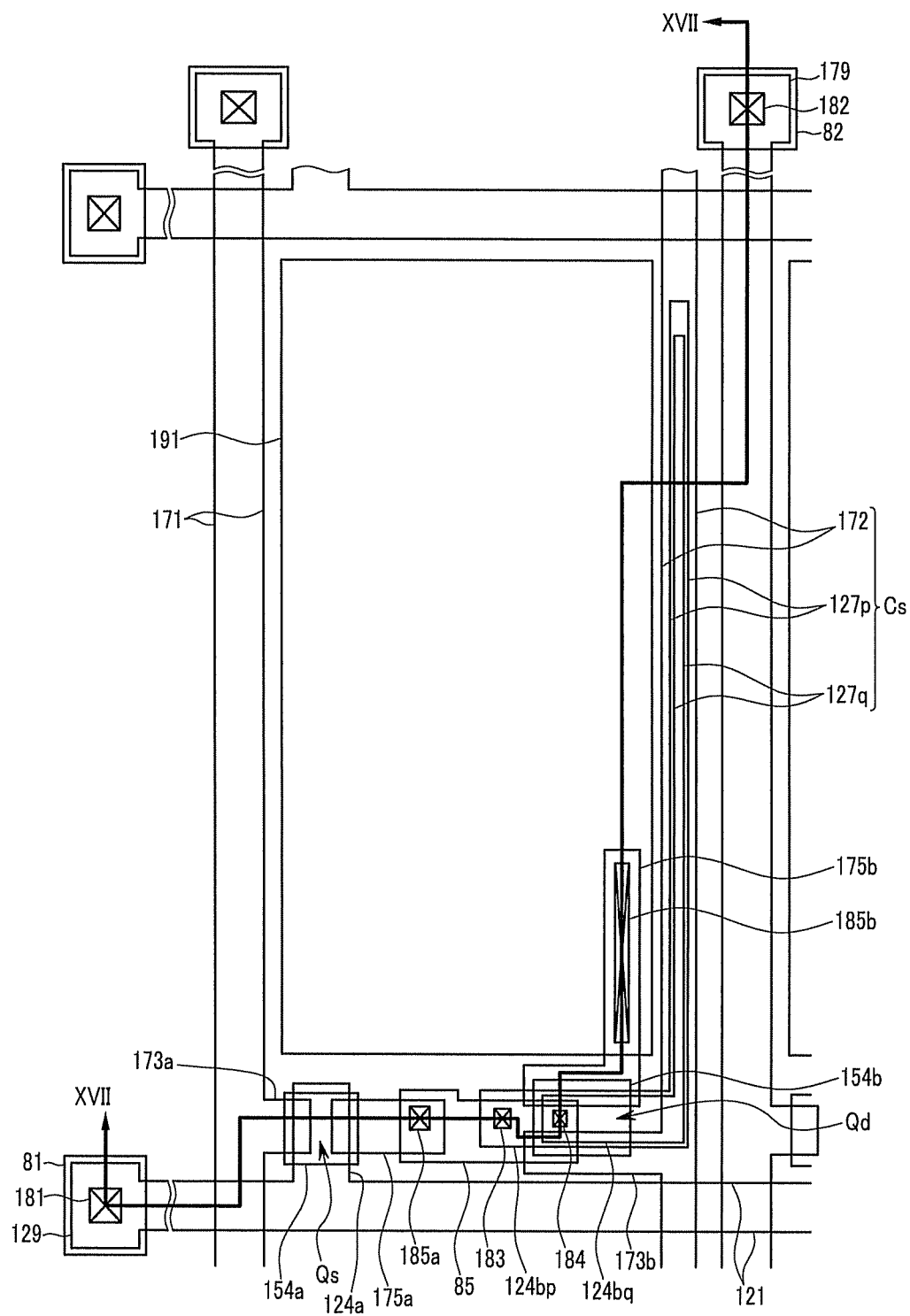
Figure 17:
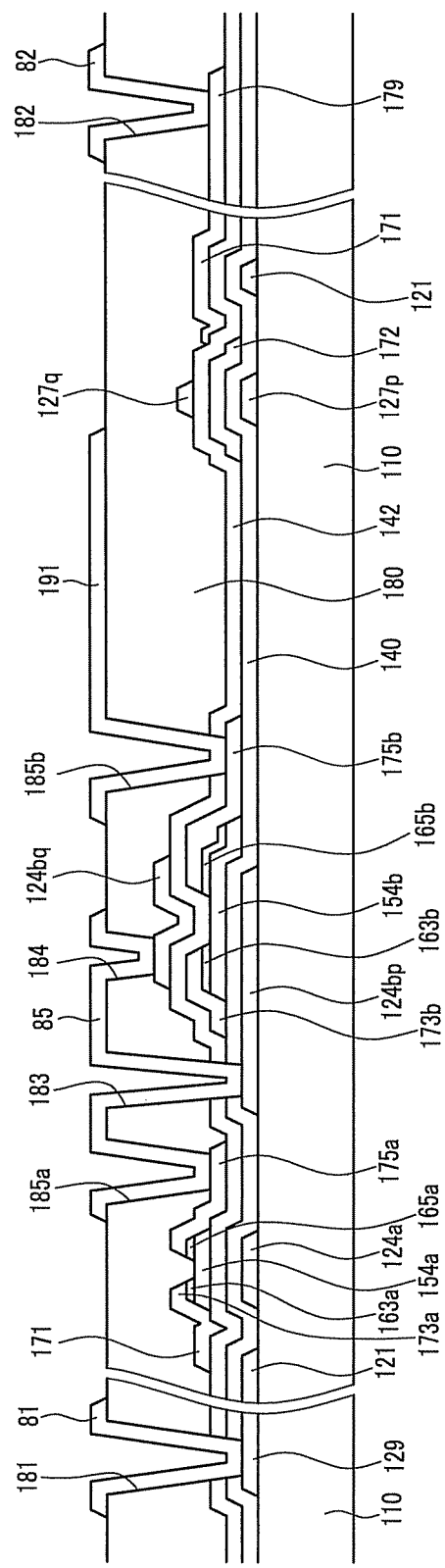
FIG. 17 is a cross-sectional view of the exemplary embodiment of an OLED display shown in FIG. 16 taken along line XVII-XVII.

Next, a transparent conductive film such as ITO is deposited on the passivation layer 180, and is subsequently patterned, in one exemplary embodiment by photolithography and etching, to form a plurality of pixel electrodes 191, a plurality of connecting members 85, and a plurality of contact assistants 81 and 82 as shown in FIG. 16 and FIG. 17.

Referring to FIG. 2 and FIG. 3, a photosensitive organic insulator is deposited on the pixel electrodes 191, the connecting members 85, the contact assistants 81 and 82, and passivation layer 180, and exposed and developed to form a partition 361 having openings 365 partly exposing the pixel electrodes 191.

Thereafter, a plurality of organic light emitting members 370 including at least a hole transport layer (not shown) and an emission layer (not shown) are formed thereon. In one exemplary embodiment the organic light emitting members 370 may be formed by a solution process such as inkjet printing and evaporation. In one exemplary embodiment wherein inkjet printing is used, a solution is dropped into the openings 365 while moving an inkjet head (not shown), and in this exemplary embodiment, a drying step for removing a solvent used in the ink-jetting follows.

Thereafter, a common electrode 270 is formed on the partition film 361 and the light emitting members 370.

The exemplary embodiment of a switching thin film transistor according to the present invention may prevent reduction of the data voltage and deterioration of display characteristics such as a reduction of the current transmitted to the light-emitting device, life time reduction, and other various defects.

Also, the exemplary embodiment of an OLED display according to the present invention includes thin film transistors sharing a common layer to reduce the number of necessary photo masks such that production processes may be simplified and production costs may be reduced.

While the present invention has been described in connection with what is presently considered to be practical exemplary embodiments, it is to be understood that the present invention is not limited to the disclosed exemplary embodiments, but, on the contrary, is intended to cover various modifications and equivalent arrangements included within the spirit and scope of the appended claims.

What is claimed is:

1. An organic light emitting diode display comprising:
a substrate;
a gate line and a data line which intersect each other and are disposed on the substrate;
a driving voltage line transmitting a driving voltage and intersecting the gate line; and
a pixel, each pixel comprising:
a switching transistor;
a driving transistor connected to the switching transistor;
a first electrode connected to the driving transistor;
a second electrode facing the first electrode; and
a light emitting member disposed between the first electrode and the second electrode,
wherein the switching transistor comprises:
a switching control electrode connected to the gate line;

a switching input electrode connected to the data line;

a switching output electrode disposed substantially opposite the switching input electrode with respect to the switching control electrode; and a switching semiconductor which overlaps the switching control electrode, and wherein the driving transistor comprises:

a lower driving control electrode disposed on the substrate and directly connected to the switching output electrode with a connecting member;

a driving semiconductor disposed on the lower driving control electrode with respect to the substrate and overlapping the lower driving control electrode; and a driving input electrode and a driving output electrode which opposes each other with respect to the driving semiconductor, wherein the lower driving control electrode and an upper driving control electrode are physically separated from each other and opposing each other with the driving semiconductor interposed therebetween in a cross-sectional view in each pixel, and the lower driving control electrode, the driving semiconductor, and the upper driving control electrode are sequentially arranged in a direction perpendicular to a surface of the substrate.

2. The organic light emitting diode display of claim 1, wherein the switching semiconductor and the driving semiconductor comprise different types of crystalline silicon.

3. The organic light emitting diode display of claim 2, wherein the switching semiconductor includes an amorphous silicon semiconductor, and the driving semiconductor includes one of a microcrystalline silicon semiconductor and a polycrystalline silicon semiconductor.

4. The organic light emitting diode display of claim 3, further comprising:

a first gate insulating layer disposed between the first driving control electrode and the driving semiconductor; and a second gate insulating layer disposed between the second driving control electrode and the driving semiconductor.

5. The organic light emitting diode display of claim 4, wherein the first gate insulating layer includes silicon oxide and the second gate insulating layer includes silicon nitride.

6. The organic light emitting diode display of claim 3, further comprising a driving voltage line connected to the driving input electrode, wherein the driving voltage line overlaps at least one of the first driving control electrode and the second driving control electrode.

7. The organic light emitting diode display of claim 3, wherein the driving voltage line is formed on a different layer from the first signal line and the second signal line.

8. The organic light emitting diode display of claim 1, wherein a layer is interposed between the switching semiconductor and the driving semiconductor so that the switching semiconductor and the driving semiconductor are formed in different layers from each other.

9. The organic light emitting diode display of claim 1, wherein the first driving control electrode is formed on the same layer as the switching control electrode.

10. The organic light emitting diode display of claim 9, wherein the second driving control electrode is formed on the same layer as the switching input electrode and the switching output electrode.

* * * * *